United States Patent
Gerber

(10) Patent No.: US 9,253,910 B2
(45) Date of Patent: Feb. 2, 2016

(54) CIRCUIT ASSEMBLY

(71) Applicant: Texas Instruments Incorporated, Dallas, TX (US)

(72) Inventor: Mark Allen Gerber, Lucas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 315 days.

(21) Appl. No.: 13/900,758

(22) Filed: May 23, 2013

(65) Prior Publication Data

US 2014/0211439 A1    Jul. 31, 2014

Related U.S. Application Data

(60) Provisional application No. 61/758,459, filed on Jan. 30, 2013.

(51) Int. Cl.
*H05K 7/00* (2006.01)
*H05K 7/02* (2006.01)
*H05K 1/18* (2006.01)

(52) U.S. Cl.
CPC ............... *H05K 7/02* (2013.01); *H05K 1/182* (2013.01); *H01L 2224/16225* (2013.01); *H01L 2924/1461* (2013.01); *H01L 2924/19103* (2013.01); *H01L 2924/19105* (2013.01); *H05K 2201/09072* (2013.01); *H05K 2201/1003* (2013.01); *H05K 2201/1053* (2013.01); *H05K 2201/10515* (2013.01); *Y10T 29/49117* (2015.01); *Y10T 29/49139* (2015.01)

(58) Field of Classification Search
CPC ............... H01L 2924/1461; H01L 2924/00; H01L 2224/16225; H01L 2924/19103; H01L 2924/19105; H05K 1/182; H05K 2201/09072; H05K 2201/1003; H05K 2201/10515; H05K 2201/1053; H05K 7/02; Y10T 29/49117
USPC ................................ 361/760, 764, 790, 813
See application file for complete search history.

(56) References Cited

U.S. PATENT DOCUMENTS

| | | |
|---|---|---|
| 5,025,114 A | 6/1991 | Braden |
| 2005/0151599 A1* | 7/2005 | Ido et al. ............. 333/133 |
| 2007/0181990 A1* | 8/2007 | Huang et al. ............. 257/686 |
| 2010/0314741 A1 | 12/2010 | Lee et al. |
| 2011/0128107 A1* | 6/2011 | Kitagawa et al. ............. 336/192 |

FOREIGN PATENT DOCUMENTS

TW        200847301 A    12/2008

OTHER PUBLICATIONS

Notification of Transmittal of the International Search Report and the Written Opinion of the International Searching Authority, or the Declaration, mailed May 15, 2014.

* cited by examiner

*Primary Examiner* — Yuriy Semenenko
(74) *Attorney, Agent, or Firm* — Steven A. Shaw; Frank D. Cimino

(57) ABSTRACT

A circuit assembly includes a substrate having a substrate electrical circuit, opposite top and bottom substrate surfaces, and a substrate hole extending through the substrate. The circuit assembly also includes a discrete component assembly electrically connected to the substrate electrical circuit and a support member attached to the discrete component. At least a portion of the discrete component is physically mounted in the substrate hole.

12 Claims, 9 Drawing Sheets

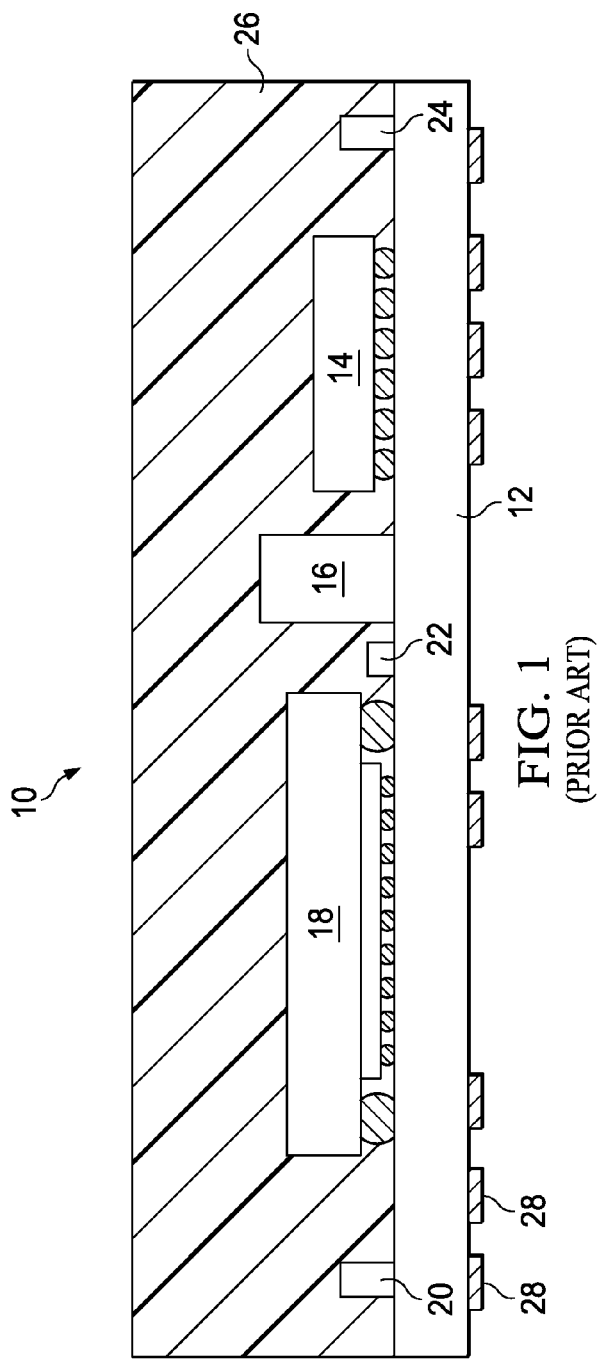
FIG. 1 (PRIOR ART)
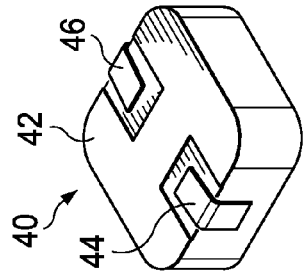
FIG. 4 (PRIOR ART)
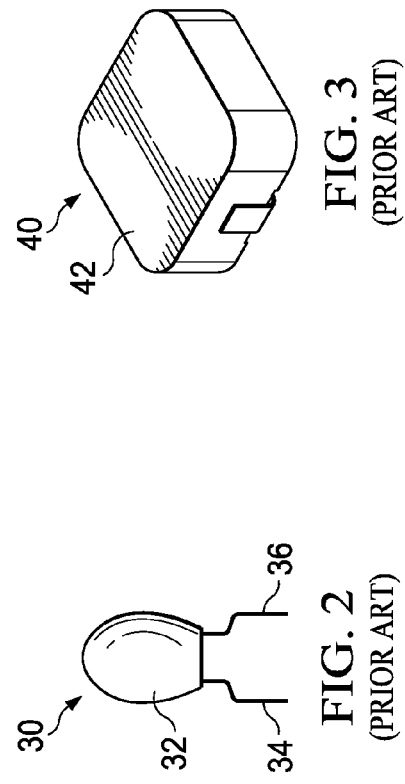
FIG. 3 (PRIOR ART)
FIG. 2 (PRIOR ART)

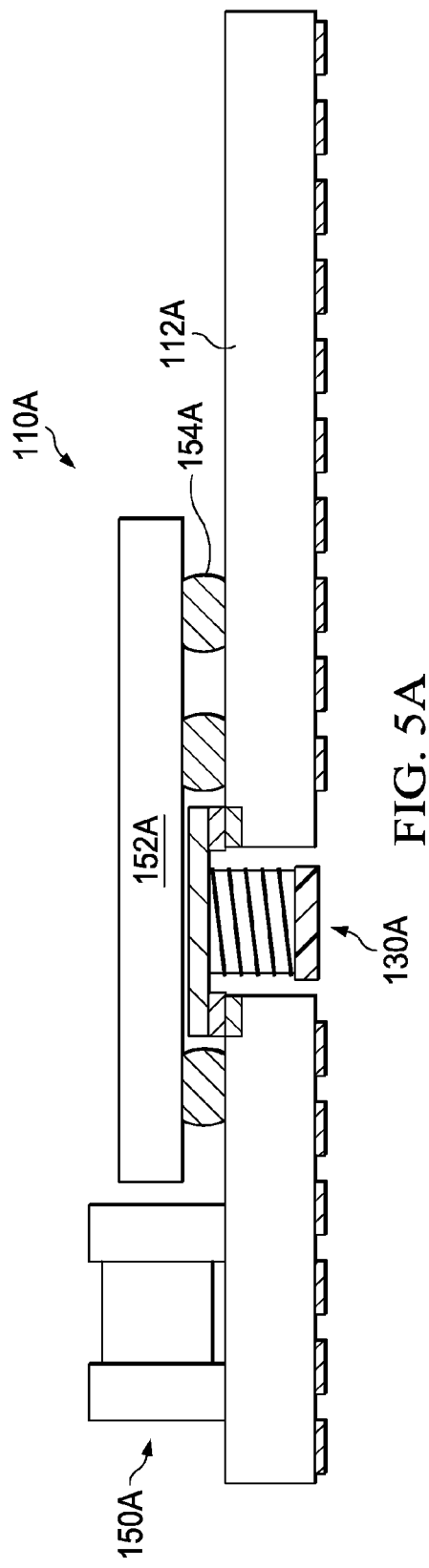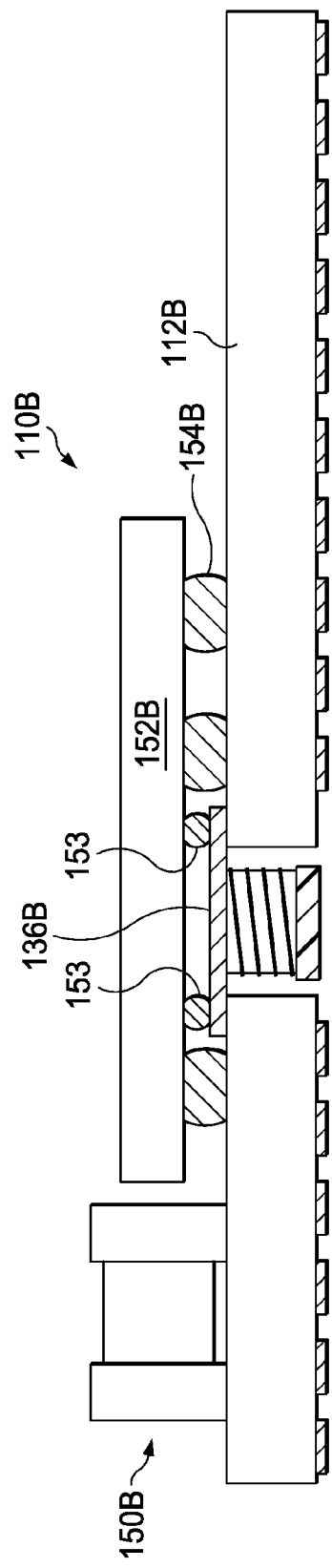

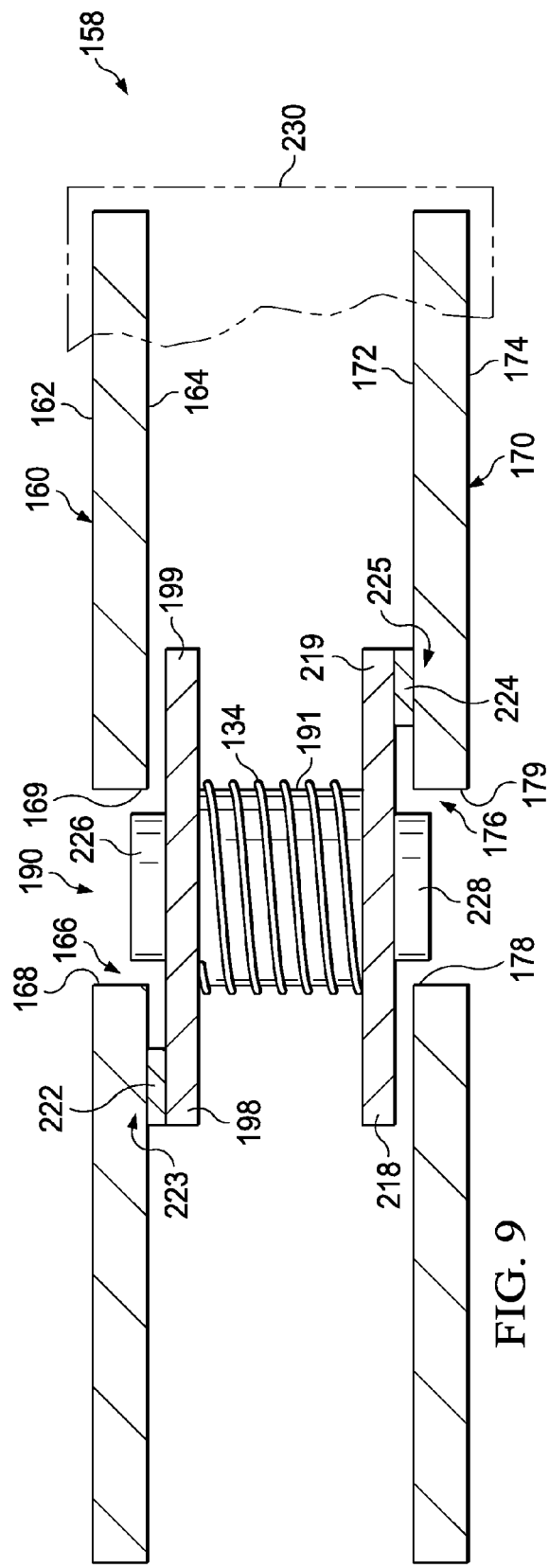
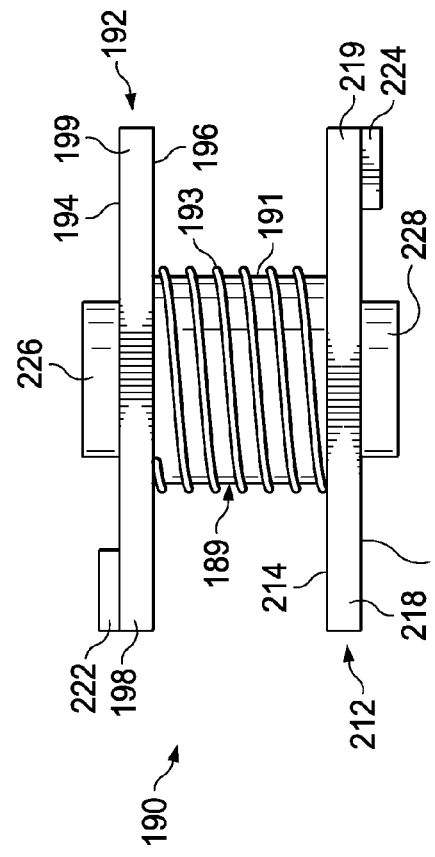
FIG. 9
FIG. 10

CIRCUIT ASSEMBLY

RELATED APPLICATION AND PROVISIONAL APPLICATION

This application is related to U.S. patent application Ser. No. 13/900,759 of Mark Allen Gerber, entitled DISCRETE COMPONENT ASSEMBLY, filed on the same date as the present application, which is hereby incorporated by reference for all that it discloses. This application claims the benefit of U.S. Provisional Application No. 61/758,459 filed Jan. 30, 2013 for Low Profile Passive Packaging, which is hereby incorporated by reference for all that it discloses.

BACKGROUND

Integrated circuit ("IC") packages are ubiquitous in modern electronic devices. A typical integrated circuit package includes an IC die ("chip") that is mounted on a substrate such as a lead frame. The die and portions of the substrate are usually covered in a layer of protective encapsulant. An IC die is a small block of semiconductor material, such as silicon, in which an electrical circuit that performs a predetermined function is provided. Some dies have contact pads on a top surface that allow the die circuit to be connected to the substrate or other electrical components by wire bonding. Another type of die known as a flipchip has an array of conductive solder balls formed on a bottom surface of the die. The solder balls are connected to corresponding contact pads of a substrate on which the die is mounted.

In some cases it may be desirable to add functionality to an IC die by attaching one or more discrete circuit components to an integrated circuit package that contains the die. The discrete components may be passive circuit elements, e.g., capacitors, inductors, and resistors. Or, the discrete components may be more complex circuit devices such as, for example, transistors, crystals, sensors, microelectromechanical system (MEMS), or oscillators. A discrete component is typically provided in a small hard surfaced package that may have various shapes, heights and sizes. Two or more electrical contacts, such as contact pads, or leads, may be provided for attaching the discrete component to corresponding electrical contacts on a die, substrate or other electrical component. The phrase "discrete component" as used herein means the primary circuitry of the component and packaging thereof. The phrase "discrete component assembly," as used herein, means the discrete component and any structure used to attach it to an electrical substrate and any electrical conductors/contacts that are provided to electrically connect the discrete component to an electrical substrate or other electrical components.

After attaching the die and discrete component(s) a layer of protective encapsulant is often applied to complete an IC package. The encapsulant usually covers the die, discrete component(s) and at least portions of the substrate. Some complex packages have multiple IC dies and multiple discrete components and are often referred to as "systems in package modules." The phrase "integrated circuit (IC) package" as used in this specification means any functional assembly that includes an IC die mounted on a substrate, including systems in package modules as well as simple die substrate assemblies, whether encapsulated or not.

There is a continuing need for manufacturers to decrease the size, and particularly the height, of IC packages to facilitate the production of ever smaller electronic devices, such as cell phones, tablet computers and smart appliances.

BRIEF DESCRIPTION OF THE DRAWINGS

FIG. 1 is a schematic cross-sectional view of a conventional integrated circuit package.

FIG. 2 is a front view of a conventional discrete component.

FIG. 3 is a top isometric view of another conventional discrete component.

FIG. 4 is a bottom isometric view of the discrete component of FIG. 3.

FIG. 5A is a side elevation view of an example embodiment substantially identical to that of FIGS. 5 and 6, but with an IC die disposed over a discrete component mounted in a hole in a substrate.

FIG. 5B is a side elevation view of an example embodiment identical to FIG. 5A, except that the discrete component is electrically connected to the IC die positioned above it.

FIG. 9 is a cross sectional elevation view of another example embodiment of a circuit assembly.

FIG. 10 is a side elevation view of an example embodiment of a discrete component assembly used in the circuit assembly of FIG. 9.

DETAILED DESCRIPTION

Figure 5:
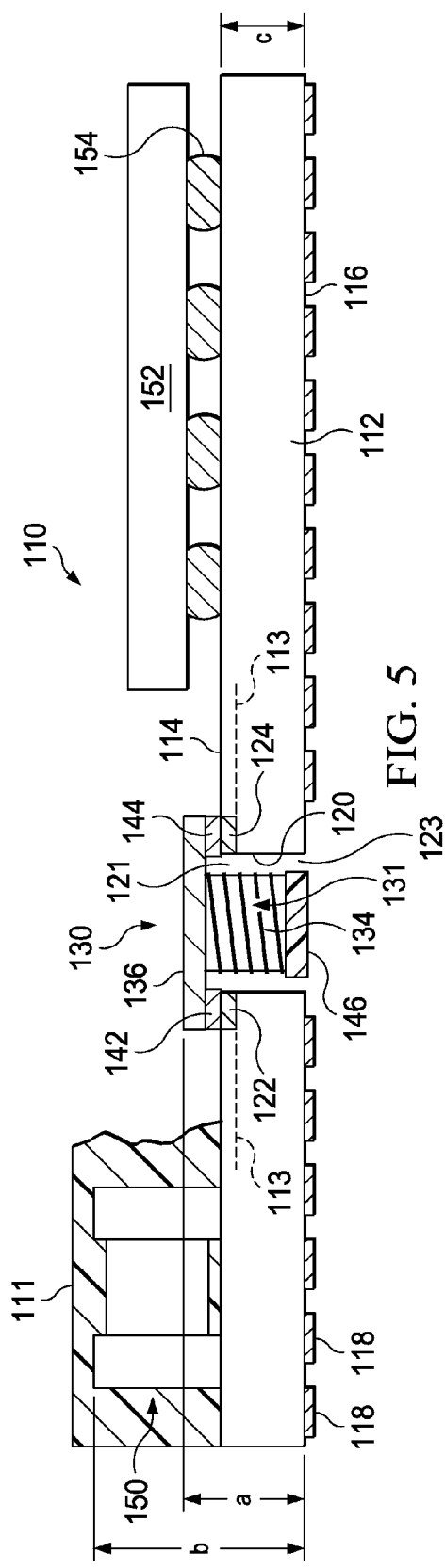
FIG. 5 is a cross sectional elevation view of an example embodiment of a circuit assembly.
Figure 6:
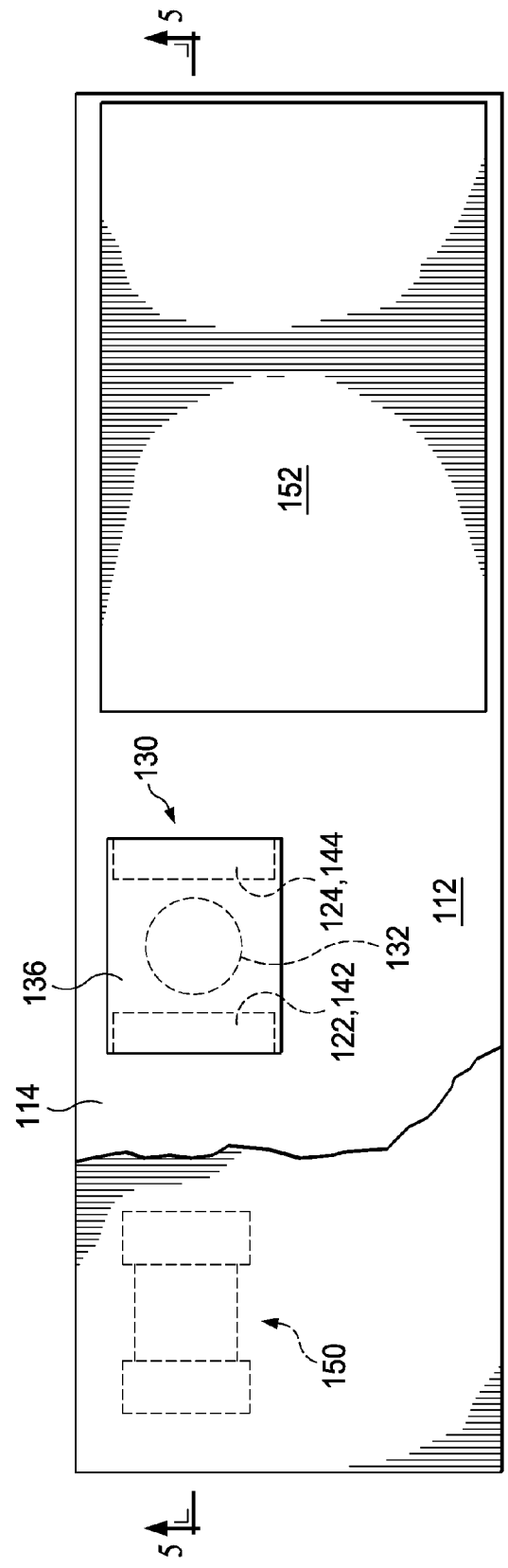
FIG. 6 is a top plan view of the circuit assembly of FIG. 5.

This specification, in general, discloses a circuit assembly 110, FIGS. 5 and 6. The circuit assembly 110 includes a substrate 112 having a substrate electrical circuit 113. The substrate 112 has opposite top and bottom substrate surfaces 114, 116. A substrate hole 120 extends through the substrate 112. A discrete component 130 is electrically connected to the substrate electrical circuit 113. At least a portion of the discrete component 130 is physically mounted in the substrate hole 120. Having thus described the circuit assembly 110 generally, the circuit assembly 110 will now be described in further detail. Other circuit assembly embodiments and methods of making circuit assemblies will also be described.

FIG. 1 is a cross sectional view of a conventional integrated circuit (IC) package 10. The IC package 10 includes a substrate 12, which may be a printed circuit board (PCB). An IC die 14, which may be a flip chip die, is mounted on a top surface of the substrate 12. A plurality of discrete components which may be passive circuit components, including a capacitor 16, and resistors 20, 22, 24 are operably mounted on the top surface of the PCB. Other components, such as an integrated circuit BGA 18 may also be mounted on the substrate 12. The substrate 12, IC die 14, capacitor 16, integrated circuit BGA 18, and resistors 20, 22, 24 may all be encased in a protective layer of epoxy 26. Contact pads 28, etc. project from the PCB 12 allowing the IC package 10 to be electrically connected to another substrate or other electronic devices.

The terms "top" and "bottom" as used herein do not imply any particular orientation with respect to a gravitational field, but rather are used in a relative sense for describing the spatial relationship between various objects, often based upon the orientation shown in a drawing figure. The terms "up," "down," "upper," "lower," "vertical," "horizontal" and similar terms are used in the same manner. For example, when describing integrated circuit package 10 shown in FIG. 1, resistors 20, 22, 24 are described as being mounted on the "top" surface of the substrate/PCB 12. Since "top" and "bottom" are used in a relative sense, this description of the PCB "top surface" is correct no matter how such an IC package 10 may be oriented within Earth's gravitational field, top up, top down or lying on its side. The situation is analogous with respect to the description of components, etc., throughout this specification and drawings.

Discrete circuit components may be provided in a variety of different shapes and sizes. FIG. 2, for example, illustrates a conventional through hole discrete capacitor component 30. Discrete component 30 includes a protective covering 32. A pair of external contacts 34, 36 are provided which enable component 30 to be attached to corresponding contacts of a printed circuit board or other electrical substrate. FIGS. 3 and 4 illustrate a discrete inductor component having a generally box shaped protective covering 42. A pair of contact pads 44, 46 are provided on one face of the discrete component 40 to enable surface mounting of the component 40 on a printed circuit board or other electrical substrate.

Power modules and many other multiple component circuit packages have size constraints based upon the intended use of the package. In compact electronic devices such as cell phones and electronic tablets, the package thickness (height) requirements continue to shrink with time. Currently, a maximum package thickness of about 1.3 to 1.4 millimeters is a maximum thickness for many integrated circuit packages, but smaller thicknesses will be mandated in future size standards and there are currently many requests from customers, to provide thinner packages. Due to the physical structures of many types of discrete components, e.g., wire windings for inductors, plates for capacitors, etc., it is difficult to shrink the height of such components without encountering performance problems.

A new type of circuit assembly is disclosed below which may enable the continued use of standard sized discrete components in reduced height circuit packages.

FIGS. 5 and 6 illustrate an integrated circuit package 110 having a substrate 112 with an internal electrical circuit 113. The substrate 112 has a top surface 114 and an opposite bottom surface 116. The substrate 112 may have a plurality of contact surfaces 118 enabling the substrate 112 and components mounted thereon to be connected to other electronic devices. The substrate 112 has a hole 120 extending between a top opening 121 in the substrate top surface 114 and a bottom opening 123 in the substrate bottom surface 116. The substrate 112 may have contact pads 122, 124 on its top surface 114 adjacent to hole 120 as further described below.

Figure 7:
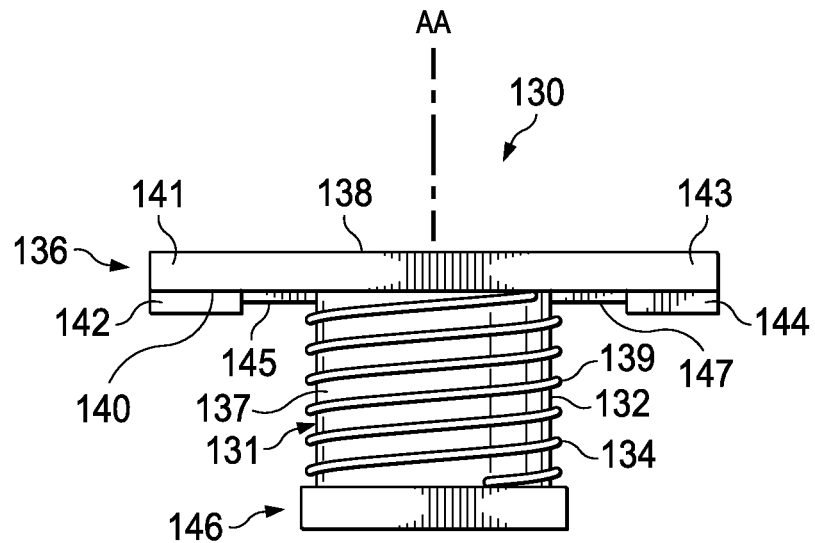
FIG. 7 is a side elevation view of an example embodiment of a discrete component assembly used in the circuit assembly of FIGS. 5 and 6.
Figure 8:
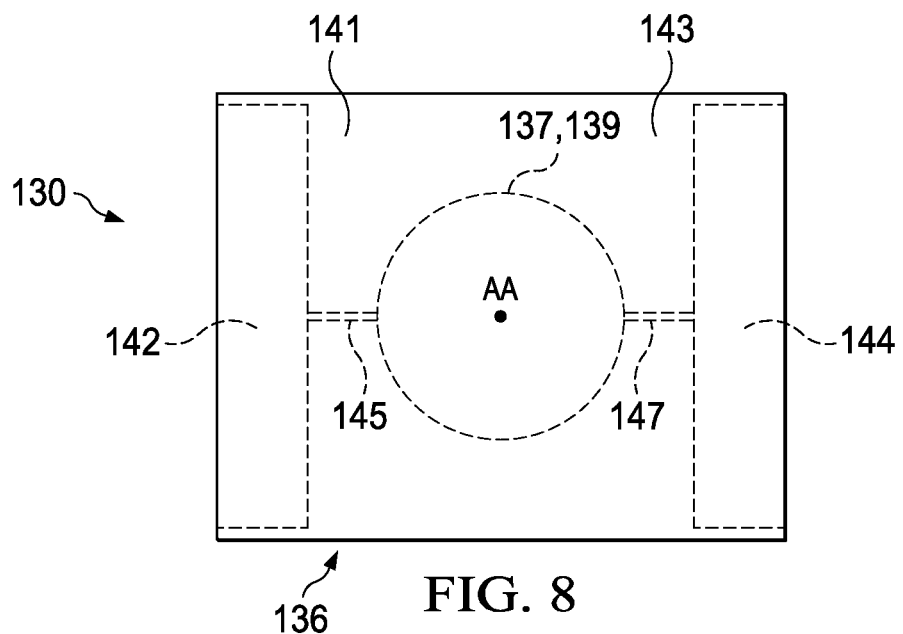
FIG. 8 is a top plan view of the discrete component assembly of FIG. 7.

A discrete component 131 of a discrete component assembly 130, FIGS. 7 and 8, is mounted in the hole 120, FIG. 5. The discrete component 131 may be an inductor having a central core 132 with a central core axis AA that is also the longitudinal axis of the discrete component 131. Wire windings of coil 134 extend around the core 132. The discrete component 131 has an outer surface 137 with a point 139 thereon that is positioned most remotely from the central axis AA.

The discrete component assembly 130 may include a top, horizontally disposed, rectangular-shaped, upper support structure 136 mounted at the upper terminal end of the discrete component 131. The horizontally disposed upper support structure 136 may have a flat top surface 138 and a flat bottom surface 140. The support structure or "flange" 136 may have a first flange portion 141 and a second flange portion 143. The first flange portion 141 and the second flange portion 143 each extend laterally beyond the hole 120 when the discrete component 131 is received in the hole 120. The discrete component assembly 130 also includes contact surfaces or pads 142, 144, which may be attached to the bottom surface 140 of each of the flange portions 141, 143, as by silver epoxy or other conductive material. The contact pads 142, 144 are also fixedly mechanically and electrically attached to the substrate contact pads 122, 124 respectively. Thus, the discrete component assembly 130 is fixedly mounted on the substrate 112 such that a portion of the discrete component 131 is positioned within the hole 120 and a portion of it is positioned outside of the hole 120. The discrete component assembly 131 is thus physically and electrically attached to the top surface 114 of the substrate 112. The horizontally disposed rectangular support structure or flange 136 may be constructed from conductive material or may be constructed from nonconductive material with electrical traces 145, 147 provided internally or on a surface portion of the flange 136 that connect the contact pads 142, 144 to the wire windings 134.

The discrete component 130 may also have a horizontally disposed bottom structure 146 mounted at the lower terminal end of the inductor core 132. In one embodiment, the bottom structure 146 has a lateral dimension that enables it to be closely slidingly received within the hole 120. The bottom structure 146 may be formed from a nonconductive material and may have a sufficient width to prevent wire windings 134 from coming into contact with the side wall of the substrate hole 120. Also, the windings 134 may be coated to prevent shorting.

As further illustrated by FIGS. 5 and 6, a second discrete component assembly 150 may be mounted on the top surface 114 of the substrate 112. An integrated circuit die 152, such as a ball grid array wafer level chip scale package, may also be operably mounted on the substrate top surface 114, as by a ball grid array 154. In some embodiments of the circuit assembly 110, a layer of encapsulating material 111 (shown only partially) may cover the IC die 152 and discrete component assemblies 130 and 150 and a portion of the substrate 112. In one specific embodiment of circuit assembly 110, the bottom of the discrete component assembly 130 is even with the bottom surface of the circuit assembly 110 and the component assembly 130 has a total height of about 1000 μm. The distance "a" from the top of the discrete component assembly 130 to the bottom surface 116 of the substrate 112 is thus about 1000 µm. The component 150 has a height of about 500 µm. The distance "b" between the top of the second (the highest) component assembly 150 and the bottom surface 116 of the substrate 112 is about 1300 µm because the height/thickness "c" of the substrate 112 is about 800 µm. The overall height of the circuit assembly 110 from the bottom surface 116 to the top of the discrete component 131 would be about 1000 µm+800 µm=1800 µm (1.8 mm) if the discrete component 131 had been mounted on the substrate top surface 114. Thus, by using the configuration shown in FIGS. 5 and 6 rather than a conventional configuration in which the bottom of each discrete component is mounted on the top surface of the substrate, the package provided is within the current target thickness standard of about 1.3-1.4 mm rather than the 1.8 mm height that it would have if component 131 were mounted on the substrate surface 114. It will also be appreciated that in some configurations of a package of the type shown in FIGS. 5 and 6, that the total height of the package may be less than the height of the tallest component of the package, particularly if the discrete component placed in the hole is the tallest component of the package. The basic effect of the above described package configuration over a conventional configuration, in many situations, is to reduce the total package height by the thickness of the substrate.

FIG. 5A illustrates an IC package 110A, which is identical to IC package 110 of FIGS. 5 and 6, except that IC die 152A is positioned above discrete component assembly 130A and has portions of ball grid array 154A removed in the region occupied by discrete component assembly 130A. It will be noted that in this configuration a large portion of the area occupied by IC 152 in FIGS. 5 and 6 is now available for the mounting of other components without physical interference with the discrete component assembly 130A. Thus, this configuration increases the unobstructed substrate surface area available for mounting of circuit components.

In FIG. 5B the IC package 110 B is identical to the one in FIG. 5A, except that the flange 136B of the discrete component assembly 130B has contact pads (not visible) on an upper surface thereof that are attached to reduced size balls 153 of the ball grid array 154B. Thus, in the embodiment of FIG. 5B, the discrete component assembly is attached directly to another component (flip chip IC die 152B) mounted on the substrate 112B, rather than to the substrate 112B.

FIG. 9 is a cross sectional elevation view of a circuit assembly 158 that includes a first lead frame 160, a second lead frame 170 and a discrete component assembly 190. The discrete component assembly 190 includes a discrete component 189 and top and bottom support structures 192, 212, FIG. 10. The discrete component assembly 190 also includes electrical contact pads 222, 224 that are mounted on the support structures 192, 212, as described in detail below.

The first lead frame 160 has a top surface 162 and a bottom surface 164. A first lead frame hole 166 extends entirely through the first lead frame 160 and has a top opening 168 and a bottom opening 169. The second lead frame 170 has a top surface 172 and a bottom surface 174. A second lead frame hole 176 extends between a top surface opening 178 and a bottom surface opening 179.

The discrete component 189 may be an inductor having a core 191 with a wire winding or coil 193 around the core 191. The discrete component assembly 190 has a laterally disposed upper support structure 192, which in one embodiment may be made from a nonconductive material. The upper support structure 192 has a top surface 194 and a bottom surface 196. The upper support structure 192 may include a laterally extending first flange portion 198 and a laterally extending second flange portion 199. The discrete component assembly 190 may also comprise a bottom structure 212 having a flat top surface 214 and a flat bottom surface 216. The bottom support structure 212 may comprise a first laterally extending flange portion 218 and a second laterally extending flange portion 219.

A first electrical contact pad 222 may be formed on the upper surface 194 of the laterally extending flange portion 198. The first electrical contact pad 222 may be affixed to a portion 223 on the lower surface 164 of the first lead frame 160. A second electrical contact pad 224 may be provided on the lower surface 216 of the second laterally extending flange portion 219. The second electrical contact pad may be attached to a second contact portion 225 of the second lead frame 170. Thus, the first and second electrical contact pads 222, 224 act to physically and electrically connect the first and second lead frames 160, 170. The top surface 194 of the (upper) second flange portion 199 may be physically attached to the portion of the first lead frame 160 positioned above it and the (lower) first laterally extending flange portion 218 may be physically attached to the portion of the second lead frame 170 positioned below it.

An upwardly extending terminal end 226 of the core 191 is positioned above the discrete component 190 upper structure 192. This upwardly extending structure 226 has a dimension smaller than that of the first lead frame hole 166 and extends into the hole 166. Similarly, a downwardly extending structure 228 which is the lower terminal end of the core 191 extends downwardly beyond lower structure 212 and extends into the hole 176 in the second lead frame 170.

Other electrical components (not shown) such as dies and discrete components may be mounted on the first lead frame top surface 162 and bottom surface 164 and the second lead frame 170, top surface 172 and bottom surface 174. The first and second lead frames 160, 170 of the circuit assembly 158 may thus be positioned more closely by the disclosed configuration than would be possible if the component 190 were mounted directly on the top surface of the second lead frame and on the bottom surface of the first lead frame. The height of the compound leadframe structure of circuit assembly 158 is thus less than the height of a conventional compound leadframe structure with a similarly sized discrete component. In one embodiment, portions of the first and second lead frames 160, 170 and the discrete component 190 may be covered in protective encapsulant 230.

Figure 11:
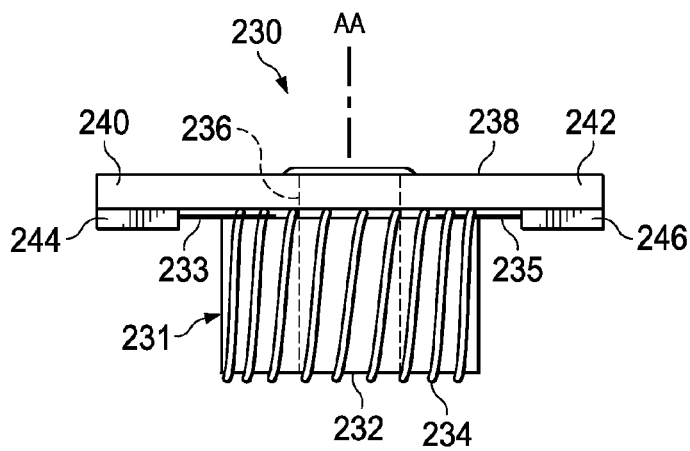
FIG. 11 is a side elevation view of an example embodiment of another discrete component assembly that may be mounted in a substrate cavity.
Figure 12:
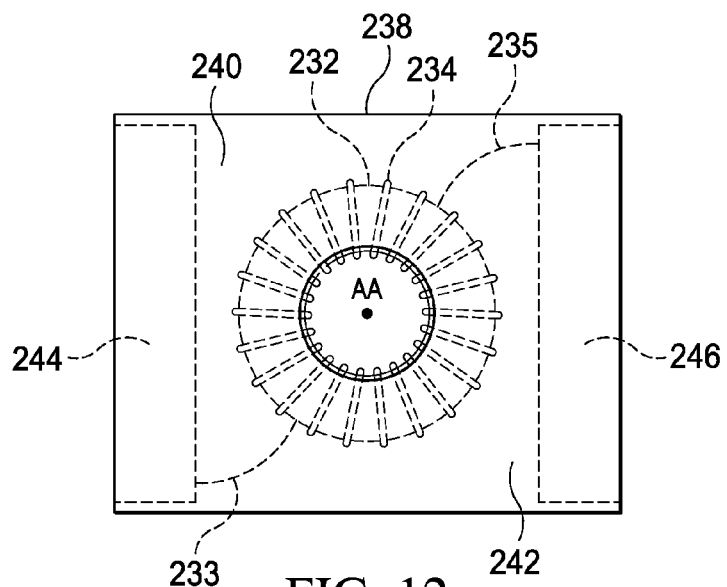
FIG. 12 is a top plan view of the discrete component assembly of FIG. 11.

FIGS. 11 and 12 illustrate a discrete component assembly 230 that includes a discrete component 231, a laterally disposed support structure 238 and contact pads 244, 246. The discrete component 231 may have a generally donut (Taurus) shaped core 232 and windings 234 about the core. The core 232 and the windings 234 have a common vertically extending axis AA. The discrete component 231 is mounted, as by a rivet 236, to the laterally disposed support structure or flange member 238 which may have a generally rectangular shape. The flange member 238 may have a first and second laterally disposed flange portion 240, 242. The first contact pad 244 and second contact pad 246 are mounted on the lower outer ends of the flange portions 242, 246. In one embodiment, the flange portions 240, 242 are constructed from a conductive material. In another embodiment, the flange portions 240, 242 are made from nonconductive material and a trace (not shown) extends either through each flange portion 240, 242 or across the upper or lower surface thereof. A first wire or trace 233 connects the windings 234 to the first contact pad 244 and a second wire or trace 235 connects the windings 234 to the second contact pad 246. The discrete component assembly 230 is adapted to have the discrete component 231 positioned within a hole in an electrical substrate with the vertical axis AA extending coaxially with the axis of the hole. The contact pads 244, 246 are adapted to be attached to contact surfaces on a surface portion of the electrical substrate adjacent to the hole.

Figure 13:
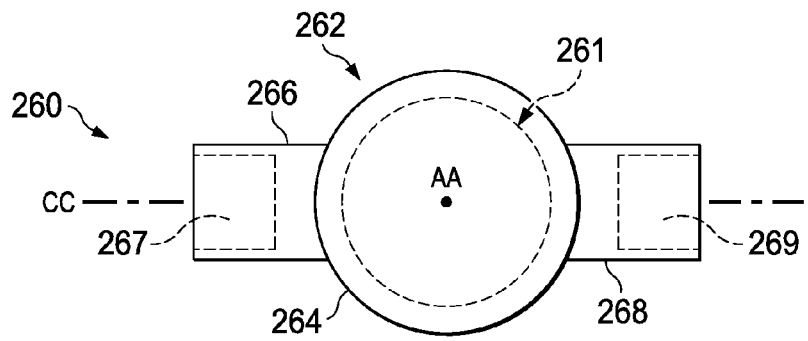
FIG. 13 is a top plan view of another example embodiment of a discrete component assembly.

FIG. 13 is a top plan view of a discrete component assembly 260 comprising a discrete component 261 and a laterally disposed top support structure or flange 262 mounted on a top portion of the discrete component 261. The top support structure 262 comprises a central circular portion 264 with first and second elongate laterally extending portions 266, 268 integrally formed therewith. The discrete component assembly 260 further comprises contact pads 267, 269 provided on a bottom surface of the laterally disposed top support structure 262. The discrete component assembly 260 is adapted to have the discrete component 261 mounted within a hole in an electrical substrate having contact pads on a top surface portion thereof that are attached to contact pads 266, 268 of the discrete component assembly 260.

Figure 14:
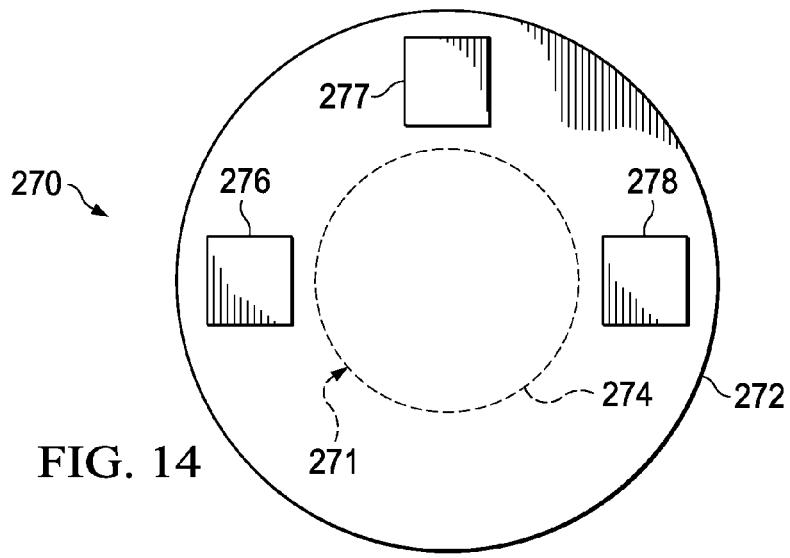
FIG. 14 is a top plan view of another example embodiment of a discrete component assembly.

FIG. 14 is a bottom plan view of a discrete component assembly 270 having a discrete component 271 and a circular flange 272 mounted on a top portion of the discrete component 271, and with three contact pads 276, 277, 278. The discrete component 271 may be a three terminal transistor with a generally cylindrical outer surface portion 274. The discrete component 271 is adapted to be positioned in a hole in an electrical substrate. The contact pads 276, 277, 278 are mounted on a lower surface of the circular flange 272 and are adapted to be connected to corresponding contact pads on the top surface of the electrical substrate on which it is mounted.

Figure 15:
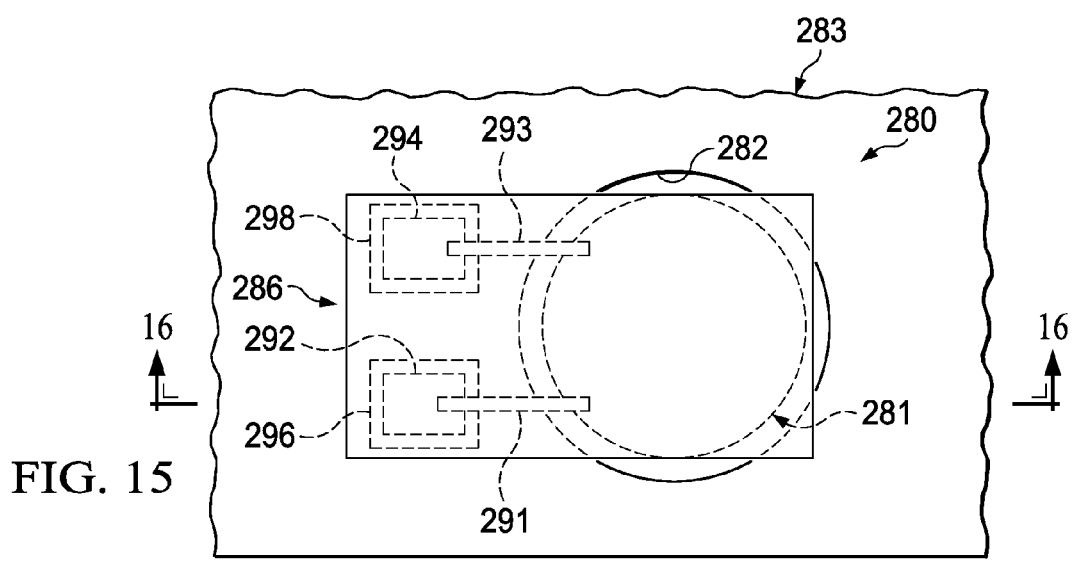
FIG. 15 is a top plan view of another example embodiment of a discrete component assembly.
Figure 16:
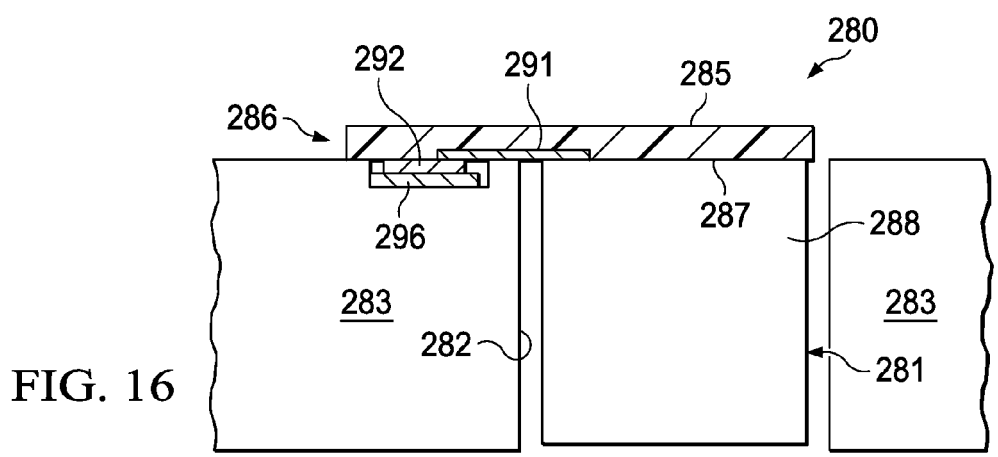
FIG. 16 is a cross sectional elevation view of the discrete component assembly of FIG. 15 mounted in a leadframe hole.

FIGS. 15 and 16 illustrate a discrete component assembly 280 having a discrete component 281, which is adapted to be mounted in a hole 282 extending through an electrical substrate 283. The discrete component assembly 280 includes a top cantilever support structure 286 mounted on a top portion of the discrete component 281. The top cantilever support structure 286 has a top surface 285 and a bottom surface 287. The discrete component assembly 280 includes first and second contact pads 292, 294 mounted adjacent one another on one longitudinal end of the cantilever support structure 286. The contact pads 292, 294 are placed into electrical contact with the discrete component 281 by first and second embedded traces 291, 293. The first and second contact pads 292, 294 on the cantilever support structure 286 are attached to corresponding first and second contact surfaces 296, 298 on the top surface of the electrical substrate 283.

Figure 17:
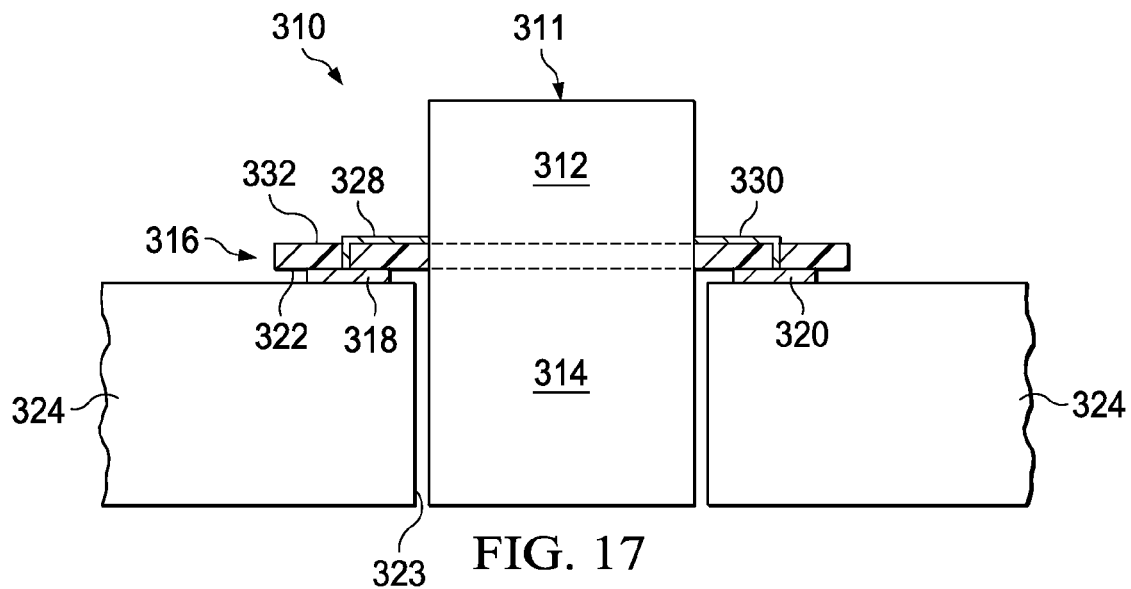
FIG. 17 is a cross sectional view of an example embodiment of another discrete component assembly mounted in a leadframe hole.
Figure 18:
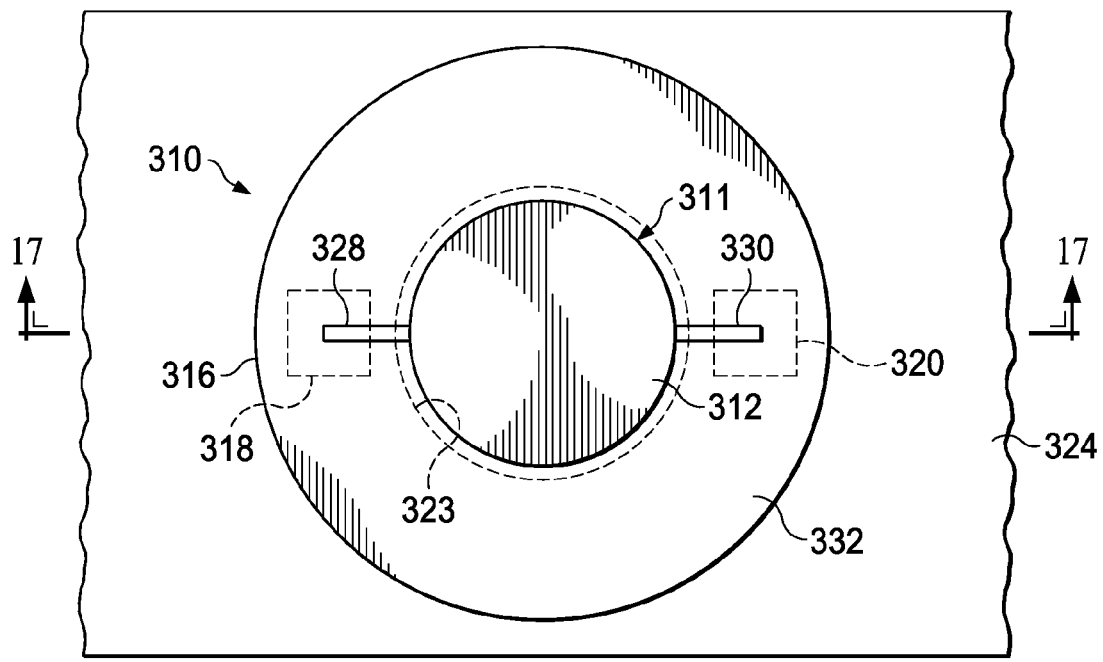
FIG. 18 is a top plan view of the discrete component assembly and leadframe of FIG. 17.

FIGS. 17 and 18 are cross sectional and top plan views, respectively, of a discrete component assembly 310 comprising a discrete component 311, a lateral support structure 316, and contact pads 318, 320. The support structure 316 is mounted on the discrete component 311 at a position that divides the discrete component 311 into an upper portion 312 and a lower portion 314. The lower portion 314 of the discrete component is positioned in a hole 323 extending through a substrate 324. Contact pads 318 and 320 are mounted on a lower surface 322 of the lateral support structure 316. Traces 328, 330 on an upper surface 332 of the lateral support structure 316 attach the contact pads 324, 326 to the discrete component 311. The traces 328, 330 extend downwardly through the lateral support structure 316 to make contact with the contact pads 324, 326. It will be seen from FIG. 17 that the lower portion 314 of the discrete component 310 may have a height equal to the depth of the hole 323. In another embodiment, the height of the lower portion 314 may be greater than the depth of the hole 323. In still another embodiment, the height of the lower portion 314 may be less than the depth of the hole 323.

Figure 19:
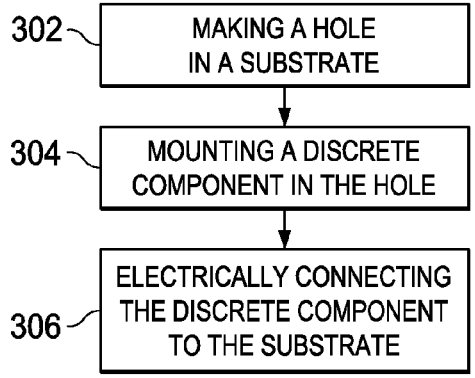
FIG. 19 is a flow diagram of an example embodiment of a method of mounting a discrete component in an integrated circuit package.

As illustrated by FIG. 19, a method of making a circuit package includes, as shown at block 302, making a hole in a substrate. The method also includes mounting a discrete component in the hole, as shown at block 304. The method further includes as shown at 306, electrically connecting the discrete component to the substrate.

Figure 20:
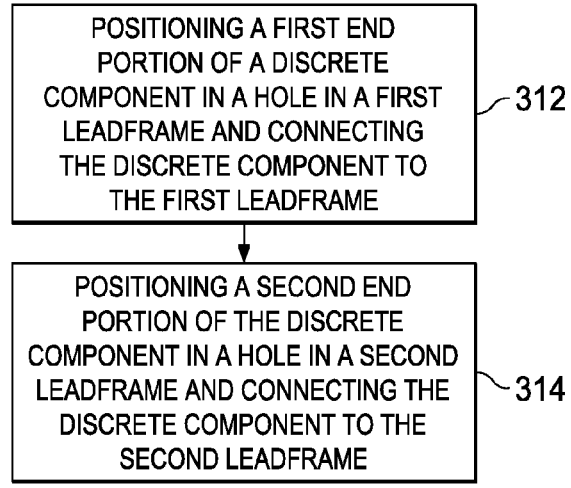
FIG. 20 is a flow diagram of an example embodiment of a method of making a dual lead frame integrated circuit package.

As illustrated by FIG. 20, a method of making a dual leadframe circuit package includes, as shown at block 312, positioning a first end portion of a discrete component in a hole in a first leadframe and connecting the discrete component to the first leadframe. The method also includes, as shown at block 314 positioning a second end portion of the discrete component in a hole in a second leadframe and connecting the discrete component to the second leadframe.

Figure 21:
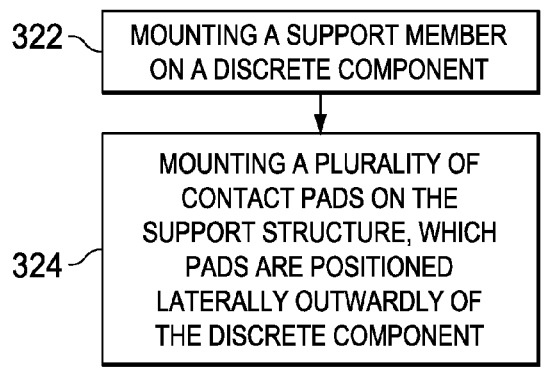
FIG. 21 is a flow diagram of an example embodiment of a method of making a discrete component assembly.

As illustrated by FIG. 21, a method of making a discrete component assembly may include, as shown at block 322, mounting a support structure on a discrete component and, as shown at block 324, mounting a plurality of contact pads on the support structure, which pads are positioned laterally outwardly of the discrete component.

Figure 22:
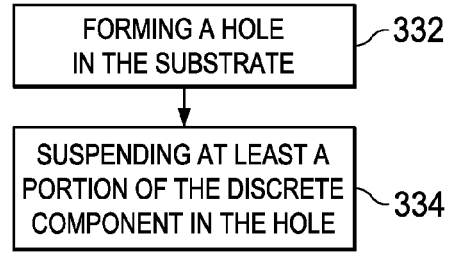
FIG. 22 is a flow diagram of an example embodiment of a method of mounting a discrete component on a substrate.

As illustrated by FIG. 22, a method of mounting a discrete component on a substrate may include, as shown at block 332, forming a hole in the substrate and, as shown at block 334, suspending at least a portion of the discrete component in the hole.

Certain inventive circuit assemblies and related methods of making and using such circuit assemblies have been expressly disclosed in detail herein. Alternative embodiments of such assemblies and methods will occur to those skilled in the art after reading this disclosure. It is intended that the appended claims be broadly construed to cover such alternative embodiments, except as limited by the prior art.

What is claimed is:

1. A circuit assembly comprising: a substrate having a substrate electrical circuit and having opposite top and bottom substrate surfaces, a substrate hole extending through said substrate; said substrate top surface has a plurality of electrical contact surfaces provided thereon; a discrete component assembly comprising: a discrete component with at least a portion of said discrete component being physically mounted in said substrate hole; a support member attached to said discrete component with at least one flange portion extending laterally beyond said substrate hole when said at least a portion of said discrete component being physically mounted in said substrate hole, wherein said at least one flange portion has a flange top surface and a flange bottom surface; and a plurality of electrical contact pads mounted on said bottom surface of said at least one flange portion of said support member and electrically connected to said plurality of electrical contact surfaces on said substrate top surface; wherein said substrate comprises a first leadframe having a to first leadframe surface and a bottom first leadframe surface with a first leadframe hole extending therebetween; and further comprising a second leadframe having a top second leadframe surface and a bottom second leadframe surface with a second leadframe hole extending therebetween, said second leadframe being positioned below and generally parallel to said first leadframe; and wherein said discrete component is positioned partially in said first leadframe hole and partially in said second leadframe hole.

2. The circuit assembly of claim 1 wherein said substrate hole is circular.

3. The circuit assembly of claim 2 wherein said discrete component support member has at least a portion thereof positioned above said upper surface.

4. The circuit assembly of claim 1 wherein at least three electrical contact pads are provided on said flange bottom surface.

5. The circuit assembly of claim 1, said circuit assembly further comprising a second discrete component mounted on said substrate with a portion thereof positioned above said discrete component assembly.

6. The circuit assembly of claim 5 wherein said portion of said second discrete component positioned above said discrete component assembly is connected to said discrete component assembly.

7. The circuit assembly of claim 1 wherein said discrete component assembly further comprises a second support member mounted on said discrete component and a plurality of contact pads electrically connected to said discrete component and mounted on said support member and said second support member and wherein said discrete component is physically and electrically connected to both said first and second leadframes.

8. The circuit assembly of claim 7 wherein said discrete component support member comprises an upper flange having at least one of said electrical contact pads mounted thereon and physically and electrically connected to said first leadframe; and wherein said discrete component second support member comprises a lower flange having at least one of said electrical contact pads mounted thereon and physically and electrically connected to said second leadframe.

9. The circuit assembly of claim 8, said upper flange having an upper surface and a lower surface; said at least one contact pad on said upper flange being positioned on said upper surface thereof.

10. The circuit assembly of claim 9, said lower flange having an upper surface and a lower surface; said at least one contact pads on said lower flange being positioned on said lower surface thereof.

11. The circuit assembly of claim 1 wherein said discrete component is positioned entirely between said upper surface of said first leadframe and said lower surface of said second leadframe.

12. The circuit assembly of claim 1 and further comprising an IC die mounted on said first leadframe over said discrete component.

* * * * *